United States Patent [19]

Matsuoka et al.

[11] Patent Number: 5,738,528
[45] Date of Patent: Apr. 14, 1998

[54] IC CARRIER

[75] Inventors: Noriyuki Matsuoka, Yokohama; Kazumi Uratsuji, Tokyo, both of Japan

[73] Assignee: Yamaichi Electronics Co., Ltd., Tokyo, Japan

[21] Appl. No.: 633,548

[22] Filed: Apr. 17, 1996

[30] Foreign Application Priority Data

Apr. 17, 1995 [JP] Japan ................. 7-116513

[51] Int. Cl.⁶ ................................................. H01R 13/60
[52] U.S. Cl. ................................. 439/41; 439/525
[58] Field of Search ........................ 324/754, 765; 439/55, 77, 41–42, 525, 526, 330–331

[56] References Cited

U.S. PATENT DOCUMENTS 4,547,794 10/1985 Tang .
4,597,617 7/1986 Enochs .
4,937,108 6/1990 Crisp et al. .
5,109,980 5/1992 Matsuoka et al. .
5,619,145 4/1997 Matsuoa .................. 324/754

*Primary Examiner*—Khiem Nguyen
*Attorney, Agent, or Firm*—Wenderoth, Lind & Ponack

[57] ABSTRACT

An IC carrier includes a carrier body for retaining a flexible wiring sheet and an IC in an opposing relation. The carrier body has suction holes formed in a flexible wiring sheet placing surface thereof and extending all the way through the carrier body. A negative pressure is applied to the flexible wiring sheet through the suction holes, thereby retaining a relative position between the flexible wiring sheet and the carrier body.

8 Claims, 9 Drawing Sheets

IC CARRIER

BACKGROUND OF THE INVENTION

1. Field of the Invention

This invention relates to an IC carrier in which flexible wiring sheet and an IC are retained in an opposing relation.

2. Brief Description of the Prior Art

Each of U.S. Pat. No. 4,547,794, U.S. Pat. No. 4,597,617, U.S. Pat. No. 4,937,108 AND U.S. Pat. No. 5,109,980 discloses an IC carrier comprising a carrier body having an IC, and a positioning pin formed on the carrier body and adapted to correctly position the flexible wiring sheet. The positioning pin is inserted into a positioning hole formed in the flexible wiring sheet, thereby correctly retaining a relative positional relation between the carrier body and the flexible wiring sheet.

However, the manufacturing tolerances of the positioning pin of the carrier body and the positioning hole of the flexible wiring sheet sometimes make the positioning accuracy insufficient.

SUMMARY OF THE INVENTION

It is therefore an object of the present invention to provide an IC carrier capable of more correctly retaining an IC.

In order to achieve the above object, there is essentially provided an IC carrier including a carrier body for retaining a flexible wiring sheet and an IC in an opposing relation. The carrier body having a suction hole formed in a flexible wiring sheet placing surface thereof and extending all the way through the carrier body. A negative pressure is applied to the flexible wiring sheet through the suction hole, thereby retaining a relative position between the flexible wiring sheet and the carrier body.

A plurality of the suction holes may be formed in the periphery of the IC receiving portion formed in the carrier body.

The flexible wiring sheet may be held between the carrier body and a carrier cover by closing the carrier cover relative to the carrier body.

By utilizing a CCD camera, a laser microscope or the like, the flexible wiring sheet is correctly placed on the carrier body, a relative position between the flexible wiring sheet and the IC is determined, and a negative pressure is applied to the flexible wiring sheet, thereby reliably retaining the relative position.

DETAILED DESCRIPTION OF THE INVENTION

One embodiment of the present invention will now be described in detail with reference to FIGS. 1 through 11 of the accompanying drawings.

Figure 1:
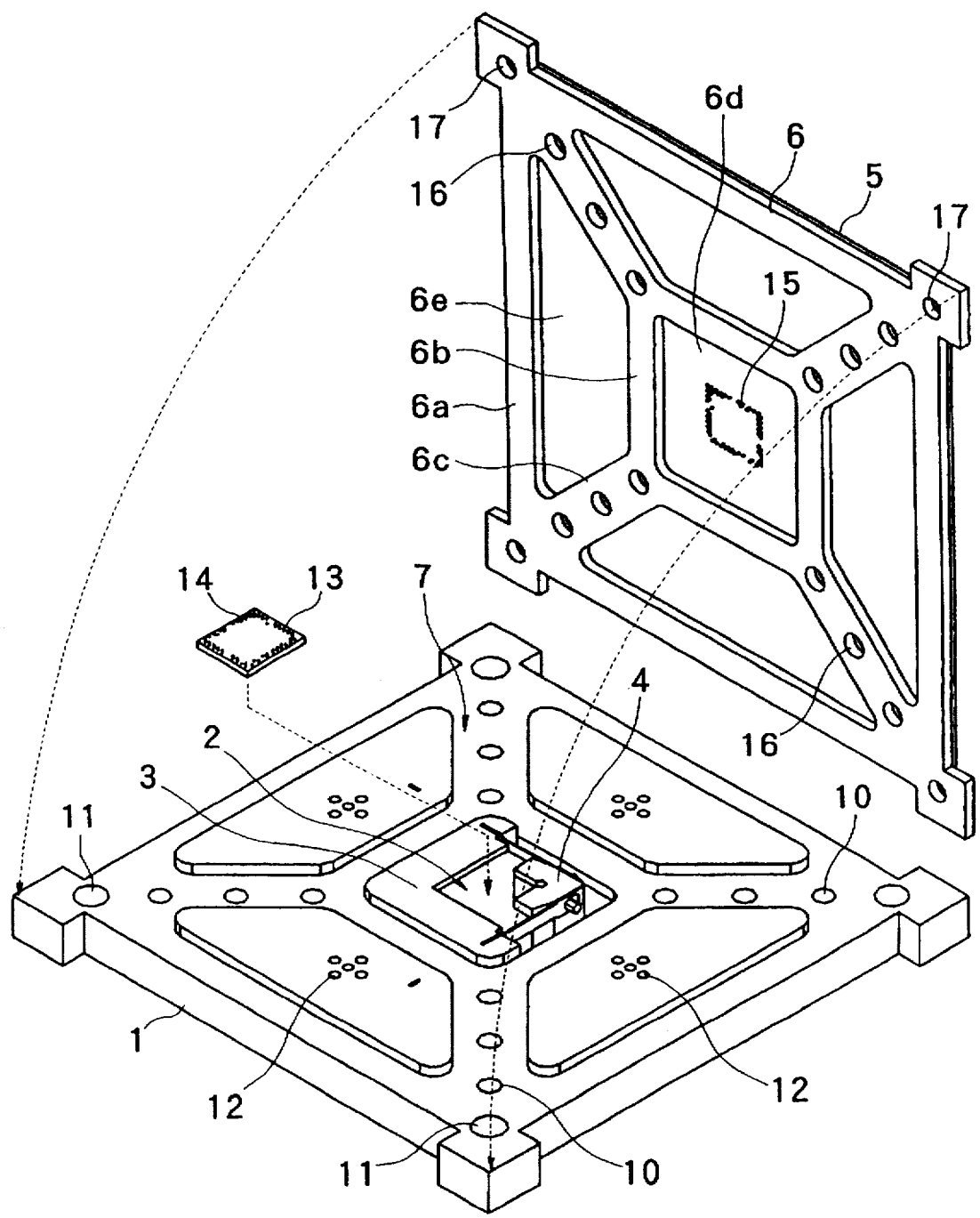
FIG. 1 is an exploded perspective view of a flexible wiring sheet and a carrier body according to the present invention.
Figure 2:
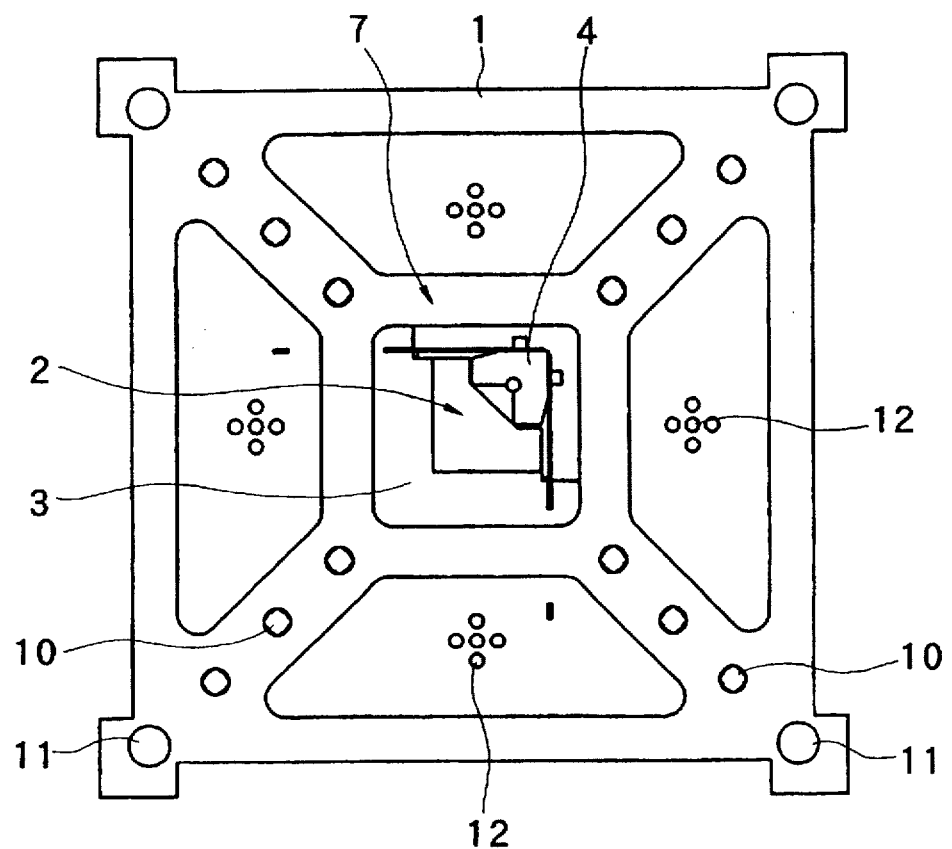
FIG. 2 is a plan view of the above carrier.

As shown in FIGS. 1 and 2, a carrier body 1 made of an insulative material has a flat and square configuration. The carrier body 1 has a generally square IC receiving portion 2 formed in a generally central portion of its one surface. The carrier body 1 has a reference corner ruler 3 disposed on one of a pair of diagonally opposing corners of the IC receiving portion 2 and adapted to regulate one corner portion of an IC body 13 when the IC body 13 is inserted in the IC receiving portion 2, and a movable corner ruler 4 disposed on the other corner portion and adapted to resiliently urge the IC body 13 against the reference corner ruler 3 when the IC body 13 is received in the IC receiving portion 2.

The carrier body 1 is formed on its surface with a backup frame receiving portion 7 having a stepped portion at a periphery of the IC receiving portion 2, an outer peripheral edge of the carrier body 1 and an area over the diagonal line of the carrier body. The backup frame receiving portion 7 is adapted to receive therein a backup frame 6 of a flexible wiring sheet 5 as later described. The backup frame receiving portion 7 is provided in a diagonally extending portion of its bottom surface with a plurality of fixing holes 10 into which fixing pins 9 of a carrier cover 8 as later described are to be inserted. Each corner portion of the carrier body 1 has an insert hole 11 into which a corresponding positioning pin of a socket is loosely inserted. The socket with the carrier assembly mounted thereon is to be subjected to testing such as in a burn-in test or the like.

A plurality of suction holes 12 are formed in areas between each side of the carrier body 1 and the IC receiving portion 2. That is, the suction holes 12 are arranged at equal spaces in the periphery of the IC receiving portion 2.

The IC body 13 has a square outer configuration. A plurality of contact pieces 14 are arranged on the surface of the IC body 13. Bumps 15 of the flexible wiring sheet 5 as will be described next are superimposed on and contacted with the contact pieces 14.

Figure 3:
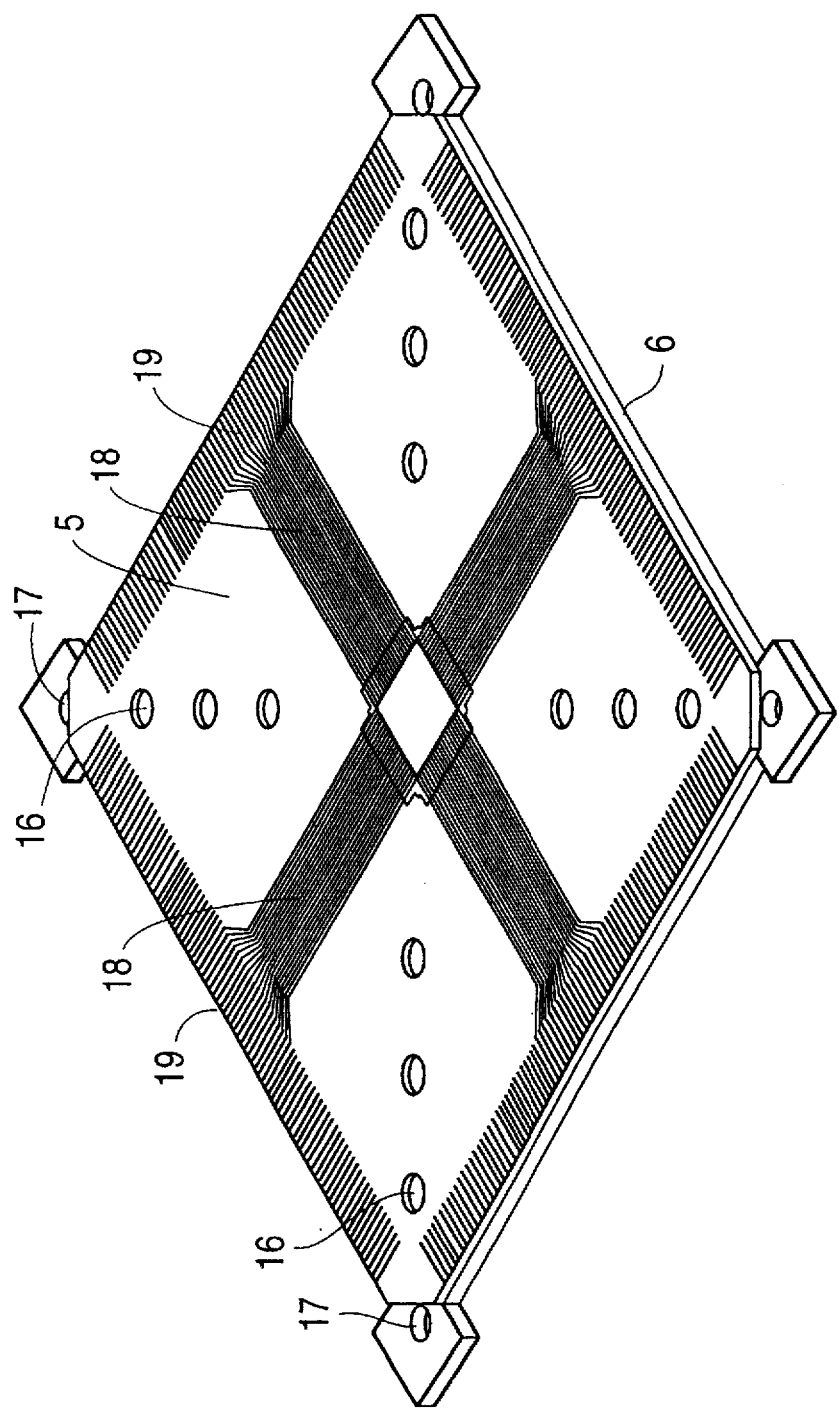
FIG. 3 is a perspective view of the flexible wiring sheet when viewed in a direction of one side surface thereof.

On the other hand, the flexible sheet 5 is made of a flexible insulative material such as, for example, a synthetic resin film and is provided on its surface with the conductive bumps 15 corresponding to the contact pieces 14 of the IC body 13, as shown in FIGS. 1 and 3. Conductive lead patterns 18 are formed to extend from the bumps 15 towards each side of the flexible wiring sheet 5. The lead pattern 18 is formed thereon with contact pads 19 which are subjected to contact with contacts of the socket. That is, the lead patterns extend in parallel relation from the central portion of the wiring sheet 5 towards an outer edge portion. Each lead pattern 18 is provided on an inner end thereof with the bump 15 and at an outer end with the contact pad 19.

The flexible wiring sheet 5 is attached with an adhesive to the backup frame 6 having a comparatively rigid property, thereby providing a laminated plate construction. The backup frame 6 includes an external frame 6a (pressure frame) extending along the four peripheral sides thereof, an internal frame 6b extending along the four peripheral sides of the IC receiving portion, and a connection frame 6c extending from each corner portion of the external frame 6a to each adjacent corner portions of the internal frame 6b and adapted to interconnect the internal and external frames 6a and 6b. The frames 6a, 6b and 6c have the flexible wiring sheet 5 attached to the surfaces thereof in order to enhance rigidity. An IC receiving window 6d is defined by the internal frame 6b. The wiring sheet 5 covers one opening surface of the IC receiving window 6d such that the bumps 15 are exposed through the window. The flexible wiring sheet 5 can be formed of a wiring board having a rigidity larger than the film or the like.

The flexible wiring sheet and the backup frame 6 have a plurality of through-holes 16 opening at the surface of the connection frame 6c. The through-holes 16 are arranged at locations corresponding to the fixing holes of the carrier body 10. Each corner portion of the backup frame 6 is provided with a positioning hole 17 at a position corresponding to the insert hole 11. The positioning pin of the socket is extended through the insert hole 11 and into the positioning hole 17. The through-hole 16 is larger than the fixing hole 10 and the positioning hole 17 is smaller than the insert hole 11.

On the other hand, as shown in FIGS. 10(A)–(C), the carrier cover 8 is made of an insulative material and has a flat and square configuration. A plurality of the fixing pins 9 corresponding to the fixing holes 10 of the carrier body 10 project from one surface of the carrier cover 8. A distal end of each fixing pin 9 is tapered.

The length of each fixing pin 9 is dimensioned such that the fixing pin 9 does not project from the back surface of the carrier body 1 when the carrier cover 8 is closed.

Figure 4:
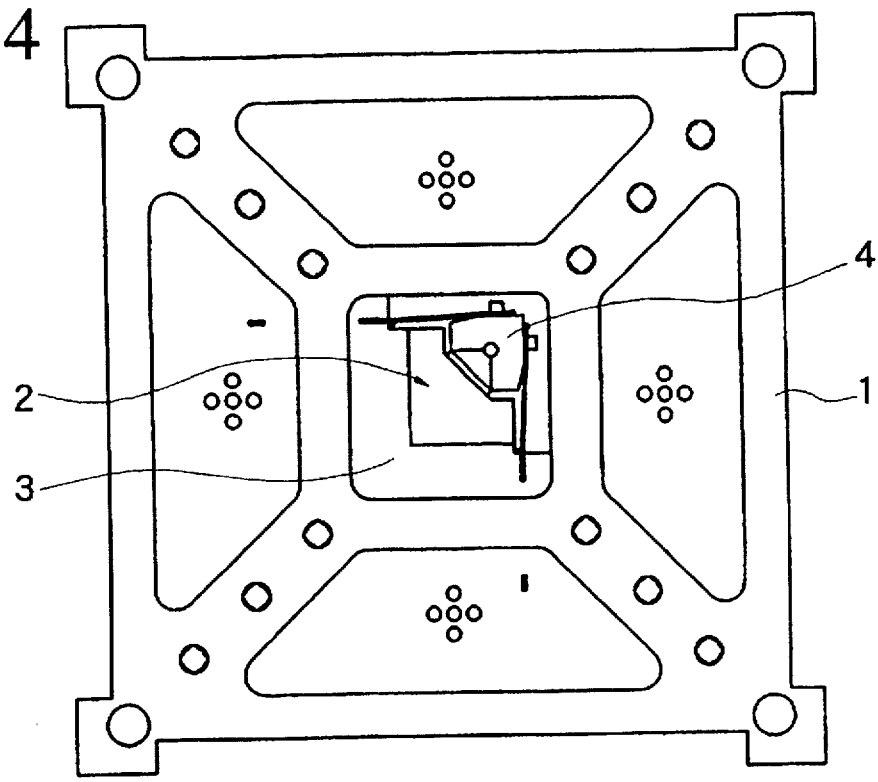
FIG. 4 is a plan view showing a displaced movable corner ruler of the carrier body.
Figure 5:
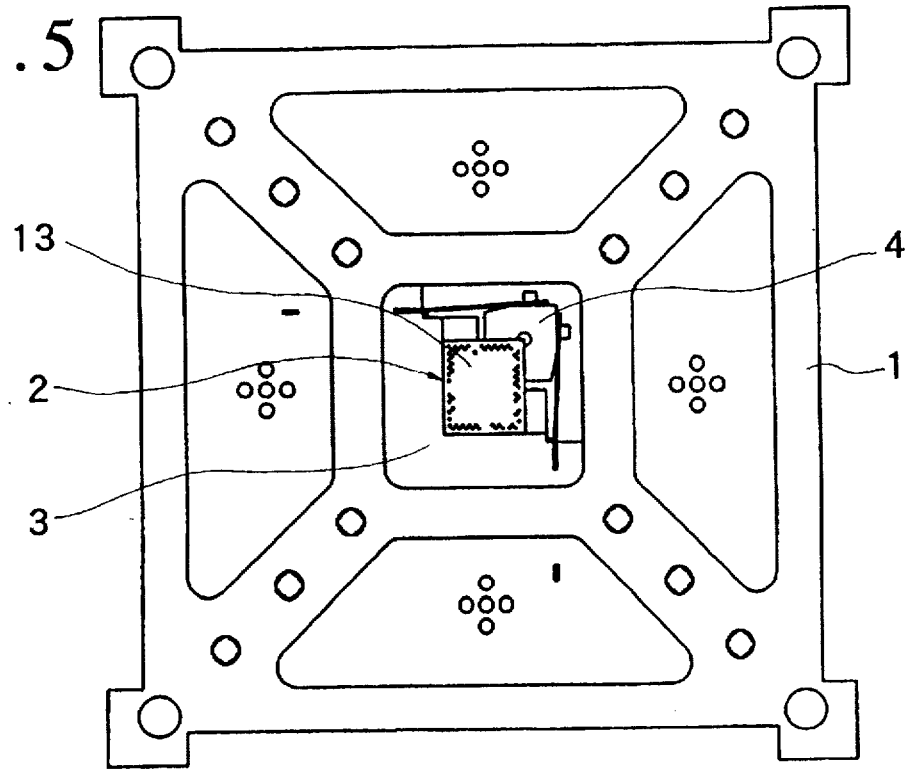
FIG. 5 is a plan view showing the carrier body and an IC body fixedly retained on the carrier body.
Figure 6:
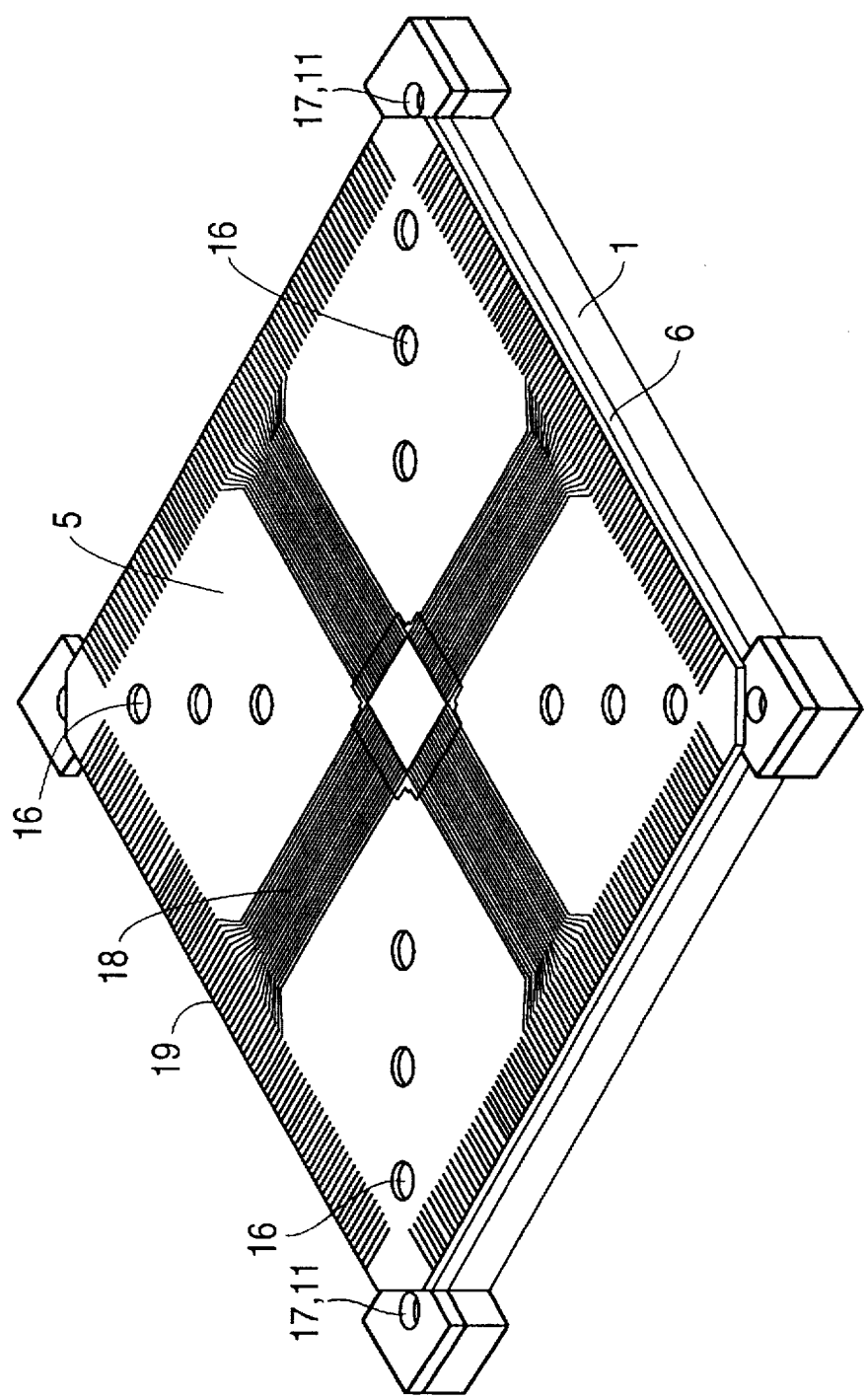
FIG. 6 is a perspective view showing the carrier body and the flexible wiring sheet placed on the carrier body.

As shown in FIGS. 4 and 5, the movable corner ruler 4 of the carrier body 1 is displaced away from the reference corner ruler 3 against the resiliency of the movable corner ruler 4, the IC body 13 is placed on the IC receiving portion 2 and the IC body 13 is fixedly retained on the carrier body 1 in accordance with the resiliency of the movable corner ruler 4.

Figure 7:
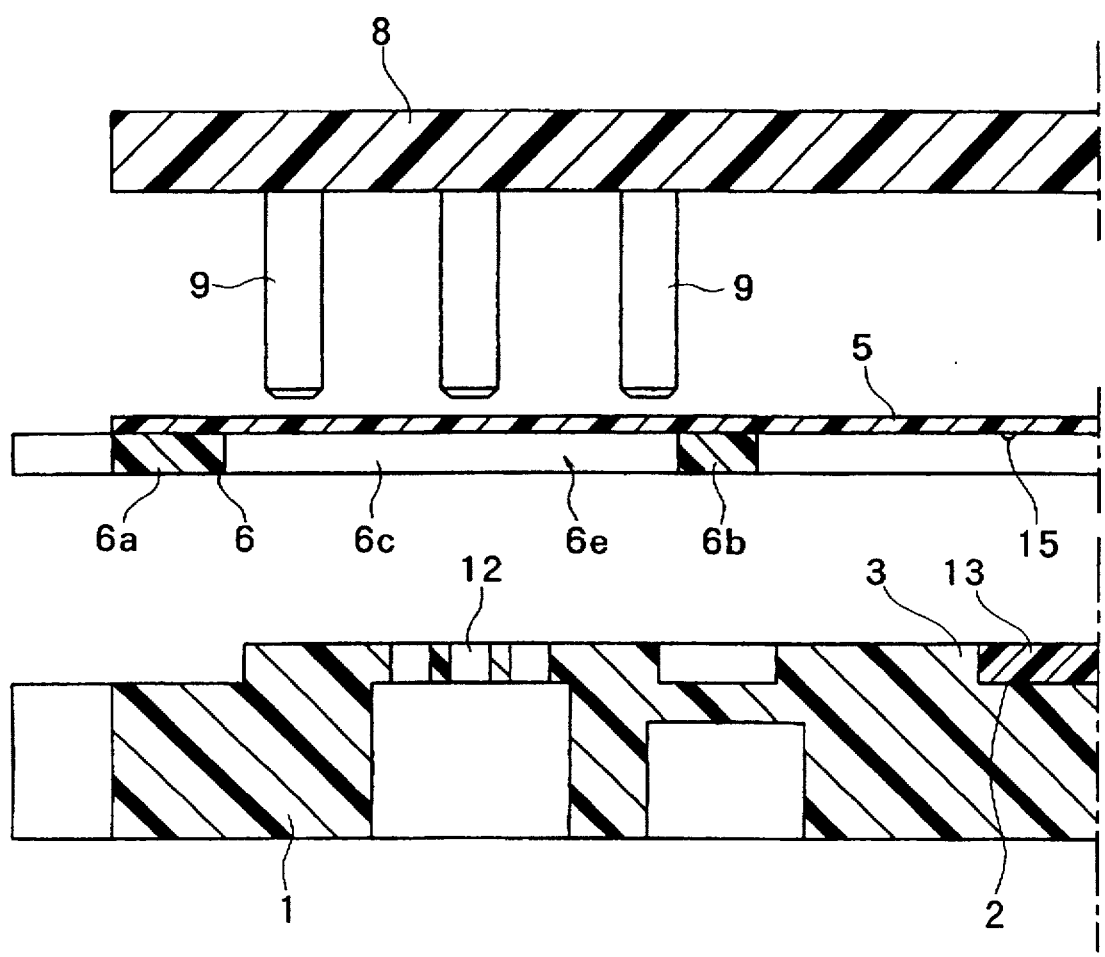
FIG. 7 is a sectional view of the carrier body, the IC body, the flexible wiring sheet and the carrier cover, showing the IC body loaded and retained on the carrier body.
Figure 8:
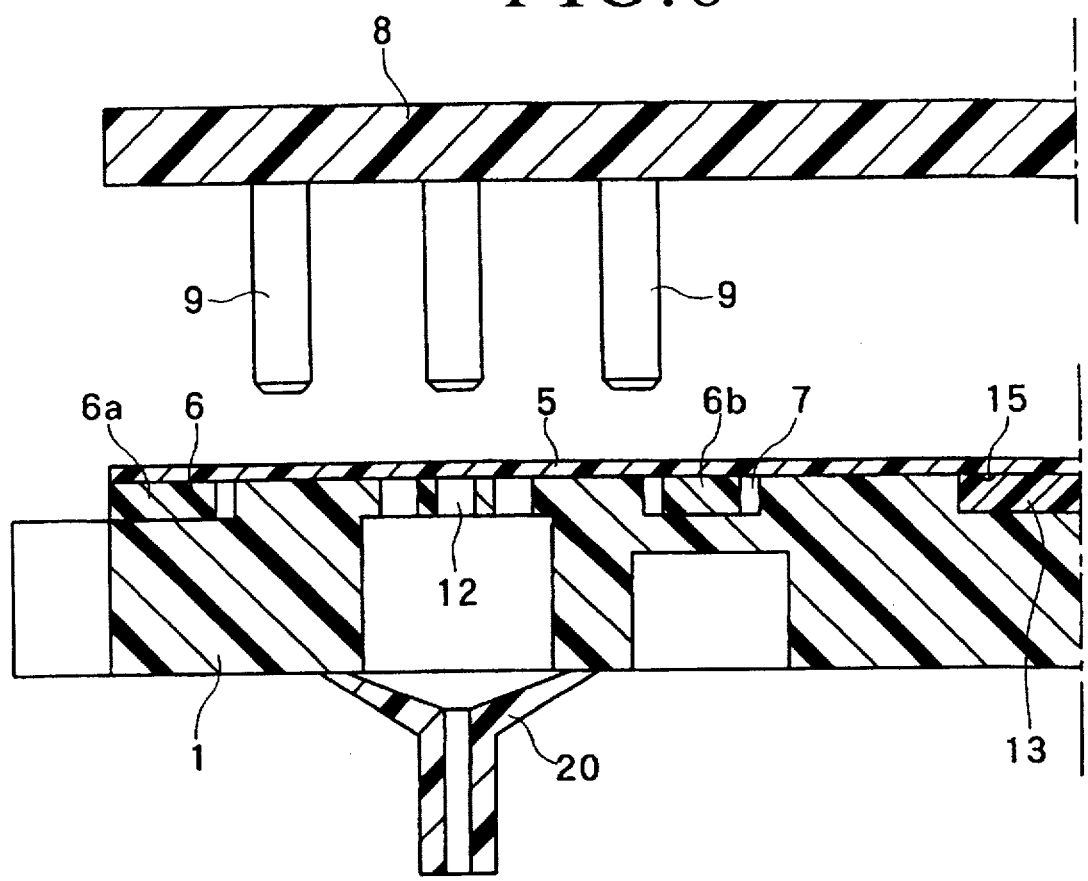
FIG. 8 is likewise a sectional view, showing a state in which the flexible sheet is correctly positioned and a negative pressure is being applied to the flexible wiring sheet through a suction hole.
Figure 9:
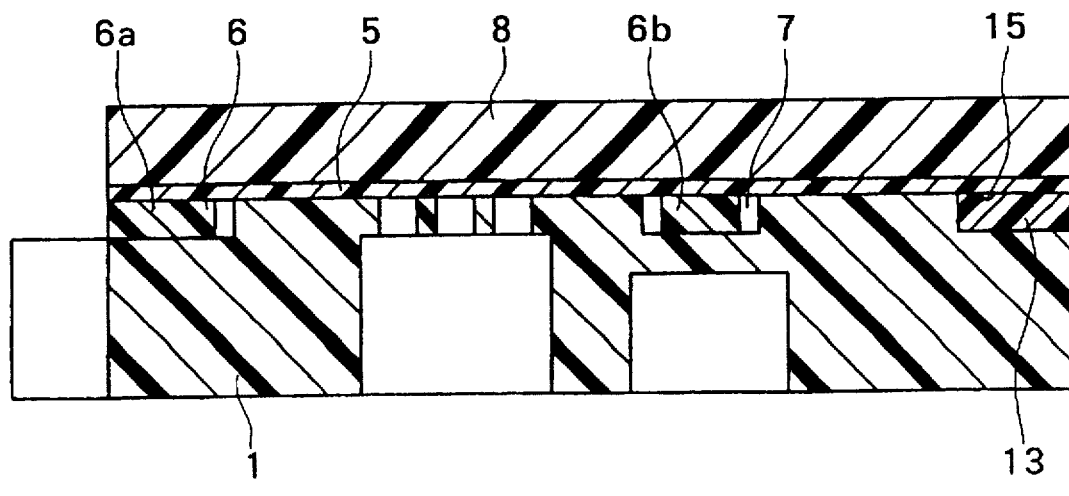
FIG. 9 is likewise a sectional view, showing a state in which a carrier cover is closed, and a correction position in the flexible wiring sheet is retained.
Figure 10:
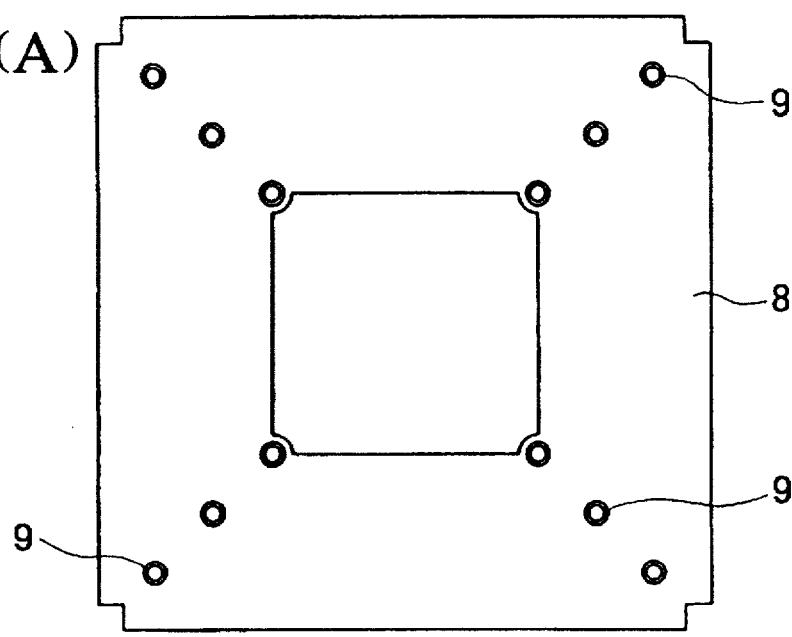
FIG. 10A is a plan view of the carrier cover.
FIG. 10B is a side view thereof and FIG. 10C is a bottom view thereof.
Figure 10:
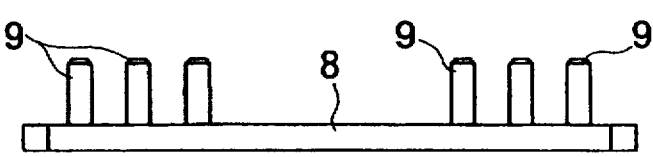
Figure 10:
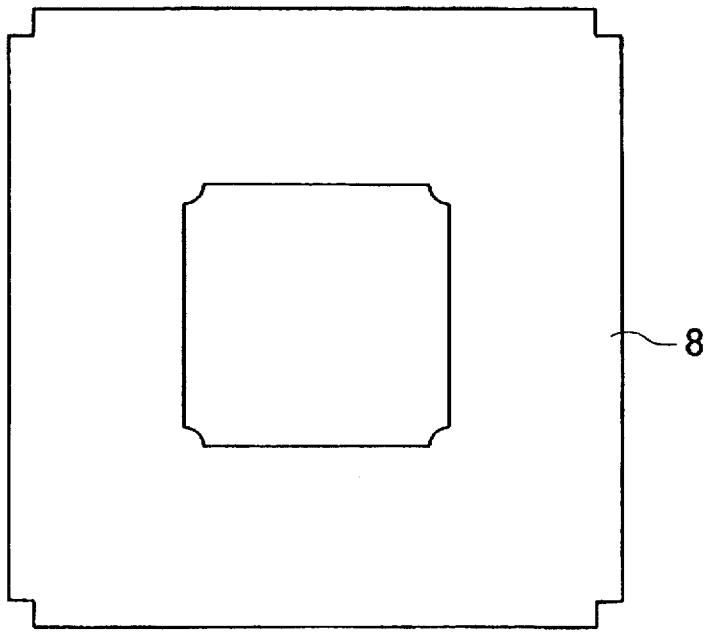
Figure 11:
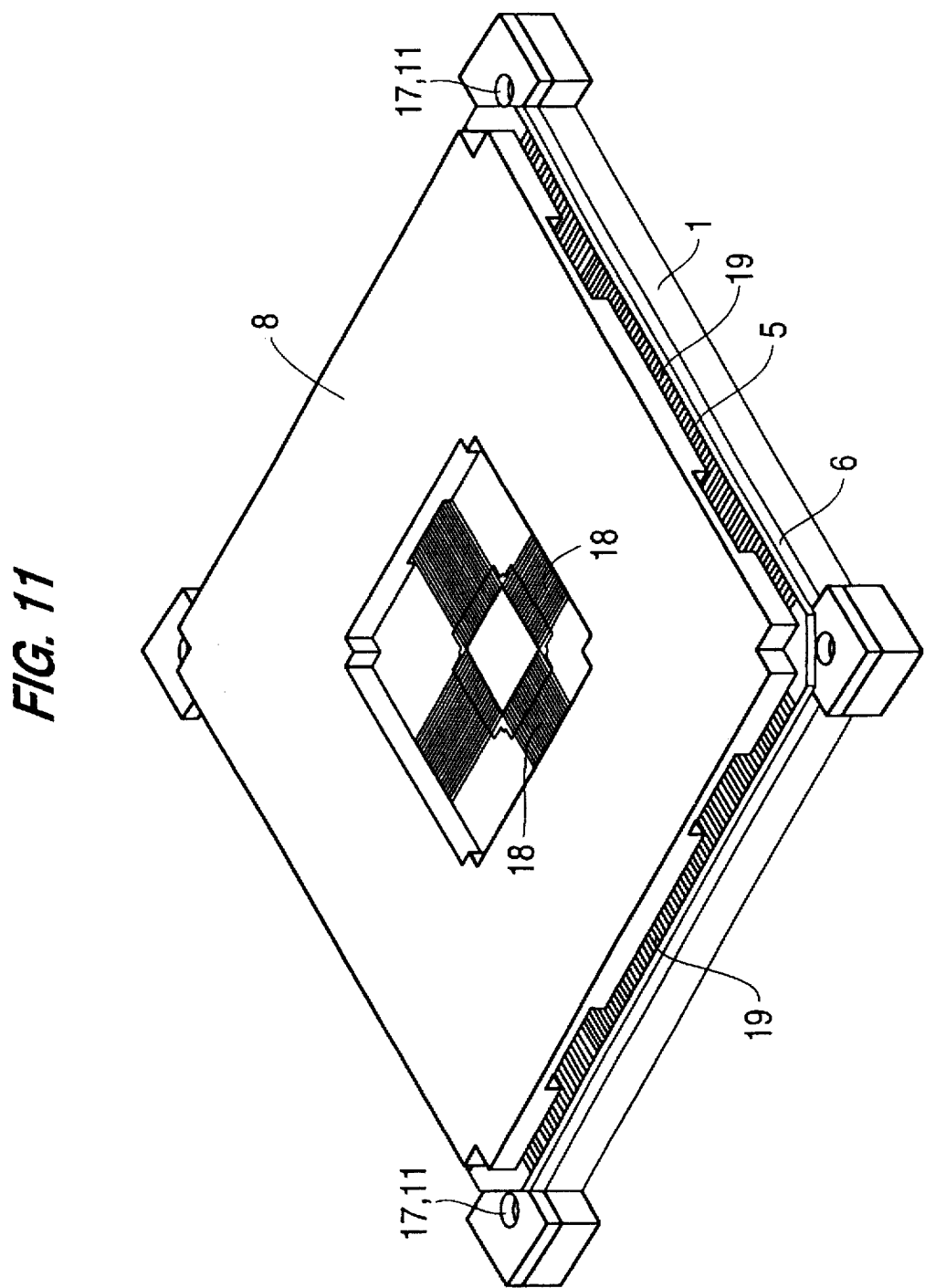
FIG. 11 is a perspective view of the carrier cover and wiring sheet in the state shown in FIG. 9.

Next, as shown in FIGS. 7 through 9, the flexible wiring sheet 5 attached to the backup frame 6 is placed in a superimposed relation on the surface of the carrier body 1. At that time, the frame portions 6a, 6b and 6c are fitted in the frame receiving portion 7 such that the frame 6 and the carrier body 1 are superimposed one upon the other. This superimposition causes the fixing holes 10 to communicate with the corresponding through holes 6 and the positioning hole 17 to communicate with the corresponding insert holes 11. Further, the suction hole forming portions (wiring sheet mounting portions) 12 are fitted in the openings 6e formed between the connection frames 6c, the suction holes 12 face the wiring sheet 5, and the IC body 13 is received in the receiving window 6d such that the IC contact pieces 14 are located opposite to the bumps 15 which face the window.

First, the location of both the IC body 13 and the flexible wiring sheet 5 placed on the carrier body 1 are correctly measured using a CCD camera or the like, and the flexible wiring sheet 5 is moved to an proper location with respect to the IC body 13. Then, in order for the flexible wiring sheet 5 to maintain its location correctly, a suction device 20 such as a vacuum pump or the like is connected to the suction holes 12 of the carrier body 1 and a negative pressure is applied to the flexible wiring sheet to maintain the wiring sheet in its proper position. In that state, the carrier cover 8 is closed, the fixing pins 9 of the carrier cover 8 are press fitted in the fixing holes 10 of the carrier body 1 through the through-holes 16, the flexible wiring sheet 5 is held between the carrier cover 8 and the carrier body 1, and the above-mentioned negative pressure is stopped while maintaining that position.

As mentioned above, the position of the flexible wiring sheet 5 is adjusted so that the flexible wiring sheet 5 s correctly positioned with respect to the IC body 5. Since the through-holes 16 of the flexible wiring sheet 5 are larger than the fixing holes 10 of the carrier body 1 as previously mentioned, the through-holes 16 are larger than the fixing pins 9 of the carrier cover 8. As a consequence, when the carrier cover 8 is closed relative to the carrier body 1, the fixing pins 9 can be inserted respectively into the corresponding fixing holes 10 of the carrier body 1 without adversely affecting the position of the flexible wiring sheet 5.

As mentioned above, the positioning holes 17 of the backup frame 6 are smaller than the insert holes 11 of the carrier body 1, and in order to bring the contact pads 19 of the flexible wiring sheet 5 into contact with the IC socket, the positioning pins of the IC socket are inserted for correct positioning into the corresponding positioning holes 17 of the backup frame 6. By doing this, the flexible wiring sheet 5 can directly and correctly be positioned irrespective of the location of the carrier body 1.

When a negative pressure is applied to the flexible wiring sheet 5 through the suction holes 1, there is a possibility that the flexible wiring sheet 5 will be deformed by the negative pressure. To prevent this, the respective suction holes may be formed of a plurality of small holes as illustrated.

As means for retaining the position by the negative pressures, there can also be provided, aside from the carrier cover 8, an adhesive tape, an adhesive material or the like. For example, the flexible wiring sheet 5 may be adhered to the carrier body 1 or the IC body 13 using a hot peelable adhesive tape, a water peelable adhesive tape or the like. For removing the IC body 13, the carrier body 1, the IC body 13 and the flexible wiring sheet 5 can be separated by applying heat or water thereto.

Also, the flexible wiring sheet 5 can have the IC body 13 already placed thereon when correctly positioned with respect to the carrier body 1.

In order to ensure a more reliable retention of the position of the flexible wiring sheet 5 when the carrier body 1 and the carrier cover 8 are closed, irregularities may be formed on selected one or on some of the contacting surfaces of the carrier body 1, the carrier cover 8 and the flexible wiring sheet 5.

As described above, according to the present invention, irrespective of the manufacturing tolerance of the positioning pins of the carrier body and the positioning holes of the flexible wiring sheet, the flexible wiring sheet can be correctly placed on the carrier body using a CCD camera, a laser microscope, or the like, and this position can be retained by applying a negative pressure to the flexible wiring sheet. In that state, the correct position can be retained using a carrier cover, an adhesive tape, an adhesive material, or the like.

although the present invention has been described in the form of one preferred embodiment, the present invention is by no means limited to this embodiment. Various changes and modifications can be made without departing from the scope of the appended claims.

What is claimed is:

1. An IC carrier for use in retaining an IC, said IC carrier comprising:

a carrier body having, at a center portion thereof, an IC receiving portion;

an IC positioning and retaining device provided in said IC receiving portion of said carrier body;

a flexible wiring sheet removably mounted on said carrier body such that, when an IC is retained in said IC receiving portion by said IC positioning and retaining device, the IC is interposed between a center portion of said wiring sheet and said IC receiving portion of said carrier body;

wherein said carrier body has wiring sheet mounting portions located outwardly of said IC receiving portion; and wherein suction holes are formed in said wiring sheet mounting portions of said carrier body outwardly of said IC receiving portion for providing suction to draw outer portions of said flexible wiring sheet to said wiring sheet mounting portions so as to retain said wiring sheet in position relative to said carrier body such that a center portion of said wiring sheet is brought into contact with the IC when the IC is retained in said IC receiving portion by said IC positioning and retaining device.

2. An IC carrier as recited in claim 1, further comprising a wiring sheet backup frame mounted to said wiring sheet and removably mounted on said carrier body for rigidifying said wiring sheet.

3. An IC carrier as recited in claim 2, wherein said carrier body has insert holes formed therein; and said wiring sheet backup frame has positioning holes formed therein and being alignable with said insert holes of said carrier body.

4. An IC carrier as recited in claim 2, wherein said carrier body has fixing holes formed therein;

said wiring sheet backup frame has through holes formed therein and being alignable with said fixing holes of said carrier body; and a carrier cover is removably mounted on said carrier body with said wiring sheet backup frame interposed between said carrier cover and said carrier body, said carrier cover having fixing pins protruding therefrom and removably inserted through said through holes of said wiring sheet backup frame and into said fixing holes of said carrier body for roughly positioning said wiring sheet relative to said carrier body.

5. An IC carrier for use in retaining an IC, said IC carrier comprising:

a carrier body having, at a center portion thereof, an IC receiving portion;

an IC positioning and retaining device provided in said IC receiving portion of said carrier body;

wherein said carrier body has wiring sheet mounting portions located outwardly of said IC receiving portion; and wherein suction holes are formed in said wiring sheet mounting portions of said carrier body outwardly of said IC receiving portion for providing suction to draw outer portions of a flexible wiring sheet to said wiring sheet mounting portions so as to retain the wiring sheet in position relative to said carrier body such that a center portion of the wiring sheet is brought into contact with the IC when the IC is retained in said IC receiving portion by said IC positioning and retaining device.

6. An IC carrier as recited in claim 5, further comprising a wiring sheet backup frame removably mounted on said carrier body for mounting and rigidifying the wiring sheet.

7. An IC carrier as recited in claim 6, wherein said carrier body has insert holes formed therein; and said wiring sheet backup frame has positioning holes formed therein and being alignable with said insert holes of said carrier body.

8. An IC carrier as recited in claim 6, wherein said carrier body has fixing holes formed therein;

said wiring sheet backup frame has through holes formed therein and being alignable with said fixing holes of said carrier body; and a carrier cover is removably mounted on said carrier body with said wiring sheet backup frame interposed between said carrier cover and said carrier body, said carrier cover having fixing pins protruding therefrom and removably inserted through said through holes of said wiring sheet backup frame and into said fixing holes of said carrier body for roughly positioning the wiring sheet relative to said carrier body.

* * * * *